(12) United States Patent
Fukui et al.

(10) Patent No.: US 12,460,303 B2
(45) Date of Patent: Nov. 4, 2025

(54) ETCHING AGENT AND METHOD FOR PRODUCING CIRCUIT BOARD

(71) Applicant: MEC COMPANY LTD., Hyogo (JP)

(72) Inventors: Yu Fukui, Hyogo (JP); Daisaku Akiyama, Hyogo (JP); Dai Nakane, Hyogo (JP); Kenji Nishie, Hyogo (JP)

(73) Assignee: MEC COMPANY LTD, Hyogo (JP)

( * ) Notice: Subject to any disclaimer, the term of this patent is extended or adjusted under 35 U.S.C. 154(b) by 257 days.

(21) Appl. No.: 18/036,313

(22) PCT Filed: Sep. 30, 2021

(86) PCT No.: PCT/JP2021/036222
§ 371 (c)(1),
(2) Date: May 10, 2023

(87) PCT Pub. No.: WO2022/102272
PCT Pub. Date: May 19, 2022

(65) Prior Publication Data
US 2023/0407486 A1    Dec. 21, 2023

(30) Foreign Application Priority Data

Nov. 11, 2020 (JP) ................... 2020-187929

(51) Int. Cl.
*C23F 1/18* (2006.01)
*C23F 11/12* (2006.01)
(Continued)

(52) U.S. Cl.
CPC ............ *C23F 1/18* (2013.01); *C23F 11/12* (2013.01); *C23F 11/14* (2013.01); *H05K 3/06* (2013.01)

(58) Field of Classification Search
None
See application file for complete search history.

(56) References Cited

U.S. PATENT DOCUMENTS 4,673,467 A * 6/1987 Nee .................. C25D 7/08
  436/98
7,393,395 B2 * 7/2008 Aiba ................ C23F 11/18
  106/14.44

(Continued)

FOREIGN PATENT DOCUMENTS

| JP | 2012129304 A | 7/2012 |
| JP | 2019502824 A | 1/2019 |
| WO | 2019013160 A1 | 1/2019 |

OTHER PUBLICATIONS

International Search Report PCT/JP2021/036222 dated Dec. 21, 2021 (pp. 1-2).

Primary Examiner — Allan W. Olsen
(74) Attorney, Agent, or Firm — Csaba Henter; Millen, White, Zelano & Branigan, P.C.

(57) ABSTRACT

The present invention includes an etching agent that selectively etches a copper layer of a processing target in which a noble metal layer containing a metal nobler than copper and the copper layer coexist, the etching agent including: a copper ion; one or more nitrogen-containing compounds selected from the group consisting of a heterocyclic compound having two or more nitrogen atoms in a ring and an amino group-containing compound having 8 or less carbon atoms; a polyalkylene glycol; and a halogen ion, in which the polyalkylene glycol is contained in an amount of 0.0005% by weight or more and 7% by weight or less, and the halogen ion is contained in an amount of 1 ppm or more and 250 ppm or less.

17 Claims, 1 Drawing Sheet

(51) Int. Cl.
   *C23F 11/14*   (2006.01)
   *H05K 3/06*    (2006.01)

(56) References Cited

U.S. PATENT DOCUMENTS

| | | | |
|---|---|---|---|
| 10,619,251 B2 | 4/2020 | Michalik et al. | |
| 2004/0026255 A1* | 2/2004 | Kovarsky | C25D 21/18 |
| | | | 205/291 |
| 2013/0289072 A1* | 10/2013 | Kitade | C07D 401/14 |
| | | | 546/256 |
| 2014/0262799 A1* | 9/2014 | Jayaraju | H05K 3/423 |
| | | | 205/118 |
| 2014/0262801 A1* | 9/2014 | Jayaraju | C25D 5/10 |
| | | | 205/131 |
| 2016/0105975 A1* | 4/2016 | Jayaraju | C25D 5/18 |
| | | | 205/104 |
| 2017/0030343 A1* | 2/2017 | Okasaka | F04B 27/1054 |
| 2017/0238427 A1* | 8/2017 | Jayaraju | C25D 7/123 |
| | | | 205/126 |
| 2019/0003061 A1* | 1/2019 | Michalik | C23F 1/02 |

* cited by examiner

ETCHING AGENT AND METHOD FOR PRODUCING CIRCUIT BOARD

TECHNICAL FIELD

The present invention relates to an etching agent and a method of manufacturing a circuit board.

BACKGROUND ART

Conventionally, as a method for forming a fine circuit pattern in a circuit board, a semi-additive process (SAP) in which a seed layer is formed on a surface of an insulating resin layer by electroless copper plating, a plating resist is provided on the seed layer to form a circuit by electrolytic copper plating, and then the seed layer remaining on a substrate between the circuits is removed by etching, and other methods are known. In this semi-additive process, a surface of a copper plating layer constituting a circuit may be plated with a metal nobler than copper (a metal having a low ionization tendency) such as gold, silver, or palladium. Therefore, when the seed layer is removed by etching, an etching agent for selectively etching copper (in particular, copper of an electroless copper plating layer) of the seed layer is required.

As an etching agent that selectively etches copper in a substrate in which dissimilar metals coexist, for example, there is an etching agent disclosed in Patent Document 1 (JP 2012-129304 A).

On the other hand, when copper conductively (electrically) connected to a metal nobler than copper comes into contact with an etching agent, a phenomenon called galvanic corrosion may occur. The galvanic corrosion is a phenomenon in which, when two metals having different ionization tendencies are put in an electrolyte solution, a local battery is formed by both metals, and the metal having a larger ionization tendency corrodes. When a substrate in which copper and a metal nobler than copper coexist as described above is etched, copper may be excessively etched partially due to the galvanic corrosion. Examples of an etching agent that suppresses such galvanic corrosion include an etchant disclosed in Patent Document 2 (WO 2019/013160). Patent Document 2 describes that such an etching agent is excellent in selective etchability of copper, can reliably suppress the galvanic corrosion, and is also excellent in etching rate.

However, since the etching agent described in Patent Document 2 is an alkaline etching agent having a pH of 7.8 to 11, there is a restriction in application to a manufacturing process. Therefore, there is a demand for an etching agent excellent in selective etchability of copper while reliably suppressing partial excessive etching due to the galvanic corrosion or the like even at a lower pH.

DOCUMENTS FOR PRIOR ART

Patent Documents

Patent Document 1: JP 2012-129304 A
Patent Document 2: WO 2019/013160 A

SUMMARY OF INVENTION

Problem to be Solved by the Invention

The present invention has been made in view of the above-described problems of the prior art, and an object of the present invention is to provide an etching agent excellent in selective etchability of copper while suppressing partial excessive etching even at a relatively low pH.

Another object of the present invention is to provide a method of manufacturing a circuit board capable of selectively etching copper while suppressing partial excessive etching at a relatively low pH.

Means for Solving the Problems

The present invention related to an etching agent is an etching agent that selectively etches a copper layer of a processing target in which a noble metal layer containing a metal nobler than copper and the copper layer coexist, the etching agent including:
  a copper ion;
  one or more nitrogen-containing compounds selected from the group consisting of a heterocyclic compound having two or more nitrogen atoms in a ring and an amino group-containing compound having 8 or less carbon atoms;
  a polyalkylene glycol; and
  a halogen ion,
  in which the polyalkylene glycol is contained in an amount of 0.0005% by weight or more and 7% by weight or less, and
  the halogen ion is contained in an amount of 1 ppm or more and 250 ppm or less.

In the present invention, the halogen ion may be at least one selected from the group consisting of a chloride ion and a bromide ion.

In the present invention, the pH may be 6.0 or more and 8.0 or less.

In the present invention, the copper ion may be contained in an amount of 0.5% by weight or more and 10.0% by weight or less.

In the present invention, the nitrogen-containing compound may be contained in an amount of 0.1% by weight or more and 30.0% by weight or less.

In the present invention, an organic acid may not be contained, or the organic acid may be contained in an amount of more than 0% by weight and less than 7% by weight.

In the present invention, the nitrogen-containing compound may be imidazoles.

In the present invention, the polyalkylene glycol may be polyethylene glycol.

In the present invention related to the method of manufacturing a circuit board, a circuit is formed by selectively etching a copper layer of a processing target in which a noble metal layer containing a metal nobler than copper and the copper layer coexist using any of the etching agents described above.

In the present invention according to the method of manufacturing a circuit board, the noble metal layer may be a layer containing gold.

Effects of Invention

According to the present invention, it is possible to provide an etching agent excellent in selective etchability of copper while reliably suppressing partial excessive etching even at a relatively low pH.

In addition, it is possible to provide a method of manufacturing a circuit board capable of selectively etching copper while reliably suppressing partial excessive etching at a relatively low pH.

DESCRIPTION OF EMBODIMENTS

Figure 1:
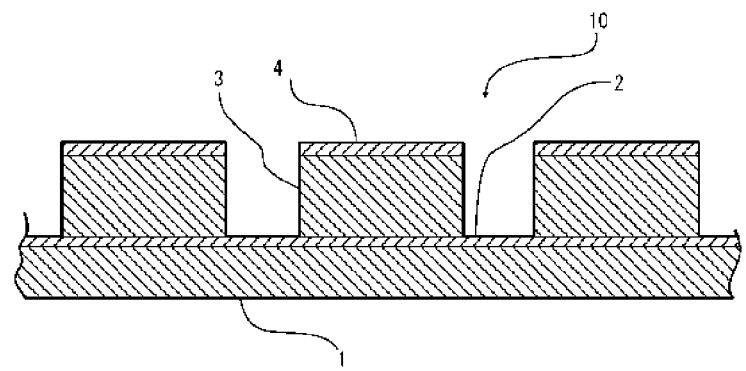
FIG. 1 is a partial cross-sectional view illustrating an outline of a circuit board.

Hereinafter, embodiments of an etching agent of the present invention and a method of manufacturing a circuit board of the present invention (hereinafter, the method is also simply referred to as a manufacturing method) will be described.

(Etching Agent)

The etching agent of the present embodiment is an etching agent that selectively etches a copper layer of a processing target in which a noble metal layer containing a metal nobler than copper and the copper layer coexist, and the etching agent includes a copper ion, one or more nitrogen-containing compounds selected from the group consisting of a heterocyclic compound having two or more nitrogen atoms in a ring and an amino group-containing compound having 8 or less carbon atoms, a polyalkylene glycol, and a halogen ion, in which the polyalkylene glycol is contained in an amount of 0.0005% by weight or more and 7% by weight or less, and the halogen ion is contained in an amount of 1 ppm or more and 250 ppm or less.

The "copper" in the present embodiment means pure copper and a copper alloy containing copper in an amount of 90% by weight or more. The "metal nobler than copper" in the present embodiment refers to a metal having a lower ionization tendency than Cu.

[Copper Ion]

The etching agent of the present embodiment contains copper ions. The copper ion is preferably a cupric ion ($Cu^{2+}$). The copper ion is supplied from a copper ion source into the etching agent. The copper ion is a component that acts as an oxidant of copper.

Examples of the copper ion source for supplying the copper ions include copper hydroxide, a copper complex of an organic acid, copper carbonate, copper sulfate, copper oxide, copper halides such as copper chloride and copper bromide, and a copper complex of a nitrogen-containing compound described later.

In particular, copper formate, copper acetate, copper chloride, copper bromide, and the like are exemplified from the viewpoint of improving an etching rate.

These copper ion sources may be used singly or in combination of two or more kinds thereof.

The content of the copper ions is, for example, 0.5% by weight or more and 10.0% by weight or less, or 1.0% by weight or more and 5.0% by weight or less as copper ions from the viewpoint of improving the etching rate.

The content of the copper ion source can be appropriately determined so as to be the content of the copper ions.

[Nitrogen-Containing Compound]

The etching agent of the present embodiment contains one or more nitrogen-containing compounds (hereinafter, also simply referred to as nitrogen-containing compounds) selected from the group consisting of a heterocyclic compound having two or more nitrogen atoms in the ring (hereinafter, the compound is also simply referred to as a heterocyclic compound) and an amino group-containing compound having 8 or less carbon atoms (hereinafter, the compound is also simply referred to as an amino group-containing compound). The nitrogen-containing compound is blended as a component that retains copper, dissolved in the etching agent, as a complex in the etching agent.

The heterocyclic compound is not particularly limited as long as it has two or more nitrogen atoms in the ring, and examples thereof include azoles such as imidazoles, pyrazoles, triazoles, tetrazoles, and derivatives thereof. From the viewpoint of complexing properties with dissolved copper, imidazoles such as imidazole and benzimidazole, or pyrazoles such as pyrazole are preferable. Specific examples thereof include imidazole, 2-methylimidazole, 1,2-diethylimidazole, benzimidazole, pyrazole, triazole, and benztriazole, and in particular, imidazole, 2-methylimidazole, 1,2-diethylimidazole, and 2-ethyl-4-methylimidazole are preferable.

[Amino Group-Containing Compound]

The amino group-containing compound is not particularly limited as long as it has 8 or less carbon atoms, and from the viewpoint of the complexing properties with dissolved copper, for example, the amino group-containing compound has 0 or more and 7 or less carbon atoms, or 0 or more and 5 or less carbon atoms.

Examples of the amino group-containing compound include ammonia; alkylammonium such as methylammonium, dimethylammonium, and trimethylammonium; alkanolamine; and aromatic amines such as aniline. In addition, an amine compound having two or more amino groups such as ethylenediamine, a quaternary amine compound such as tetramethylammonium, and the like are also exemplified. Particularly, ammonia and an alkanolamine are preferable from the viewpoint of the complexing properties with dissolved copper.

Specific examples of the alkanolamine include monoethanolamines such as monoethanolamine, N-methylethanolamine, N-ethylethanolamine, N-butylethanolamine, N,N-dimethylethanolamine, N,N-diethylethanolamine, and 2-(2-hydroxy)ethoxyethanolamine, and derivatives thereof; diethanolamines such as diethanolamine, N-methyldiethanolamine, and N-butyldiethanolamine, and derivatives thereof; triethanolamine; propanolamine; isopropanolamine; hydroxyethyl piperazine; and derivatives thereof. Particularly, monoethanolamine, triethanolamine, and N-methyldiethanolamine are preferable from the viewpoint of the complexing properties with dissolved copper.

From the viewpoint of the complexing properties with dissolved copper, the nitrogen-containing compound is preferably imidazoles, pyrazoles, ammonia, or alkanolamine, and more preferably 2-methylimidazole, imidazole, 1,2-diethylimidazole, 2-ethyl-4-methylimidazole, triethanolamine, monoethanolamine, or N-methyldiethanolamine.

The content of the nitrogen-containing compound is, for example, 1.0% by weight or more and 30.0% by weight or less, 5.0% by weight or more and 25.0% by weight or less, or 10.0% by weight or more and 20.0% by weight or less. When the content of the nitrogen-containing compound is within the above range, the etching rate can be improved, and at the same time, an increase in viscosity of the etching agent can be suppressed.

The nitrogen-containing compound may be either one or both of a heterocyclic compound and an amino group-containing compound.

In addition, as the nitrogen-containing compound, the above-described components may be used singly or in combination of two or more kinds thereof.

It is preferable to use both a heterocyclic compound and an amino group-containing compound.

When both a heterocyclic compound and an amino group-containing compound are used as the nitrogen-containing compound, examples thereof include a combination of azoles as the heterocyclic compound and an alkanolamines as the amino group-containing compound. Specifically, for example, one or two or more kinds of imidazole, 2-methylimidazole, 1,2-diethylimidazole, and 2-ethyl-4-methylimidazole are selected as the heterocyclic compound, and one or two or more kinds of triethanolamine, monoethanolamine, and N-methyldiethanolamine are selected as the amino group-containing compound.

In this case, the content of the azoles is, for example, 0.1% by weight or more and 25% by weight or less, 1.0% by weight or more and 20% by weight or less, or 3.0% by weight or more and 10% by weight or less, and the content of the alkanolamines is, for example, 0.1% by weight or more and 25% by weight or less, 1.0% by weight or more and 20% by weight or less, or 2.5% by weight or more and 11% by weight or less.

[Polyalkylene Glycol]

The etching agent of the present embodiment contains a polyalkylene glycol. The polyalkylene glycol is a component that suppresses excessive etching due to galvanic corrosion and promotes uniform etching.

The polyalkylene glycol of the present embodiment also includes a polyalkylene glycol and a derivative thereof.

The polyalkylene glycol is not particularly limited, and examples thereof include polyethylene glycol, polypropylene glycol, polybutylene glycol, and polyoxyethylene-polyoxypropylene block copolymer. In particular, polyethylene glycol is preferable from the viewpoint of improving finish such as suppression of etching unevenness. When polyethylene glycol is used, polyethylene glycol having a weight average molecular weight of 200 to 20,000 or the like is preferable.

The content of the polyalkylene glycol is, for example, 0.0005% by weight or more and 7% by weight or less, or 0.001% by weight or more and 5% by weight or less from the viewpoint of suppressing excessive etching and the like.

[Halogen Ion]

The etching agent of the present embodiment contains halogen ions. Halogen ions are components that improve the solubility and dissolution stability of copper and increase the etching rate.

The halogen ion source that supplies halogen ions into the etching agent is not particularly limited, and examples thereof include inorganic acids such as hydrochloric acid, hydrobromic acid, and hydroiodic acid; and inorganic salts such as copper chloride, copper bromide, iron chloride, sodium chloride, sodium iodide, ammonium chloride, and ammonium bromide.

The kind of the supplied halogen ion is not particularly limited, and examples of halogen elements include chlorine, iodine, and bromine. In particular, from the viewpoint of achieving both suppression of the galvanic corrosion and optimization of the etching rate, the halogen ion is preferably at least one selected from the group consisting of a chloride ion and a bromide ion.

The content of halogen ions is, for example, 1 ppm or more and 250 ppm or less, 2 ppm or more and 200 ppm or less, or 4 ppm or more and 100 ppm or less from the viewpoint of setting the etching rate to a proper range.

More specifically, the range is, for example, 50 ppm or more and 200 ppm or less when the halogen ion is a chloride ion, and 2 ppm or more and 40 ppm or less when the halogen ion is a bromide ion.

[Organic Acid]

It is preferable that the etching agent of the present embodiment does not contain or slightly contains an organic acid. The organic acid has an action of improving the solubility of copper in the etching agent, but also has an action of promoting excessive etching due to the galvanic corrosion, and therefore, it is preferable that the organic acid is not contained, or even when the organic acid is contained, the amount is preferably more than 0% by weight and less than 7% by weight, or 1% by weight or more and 6% by weight or less.

When the organic acid is contained, the type of the organic acid is not particularly limited, and examples thereof include aliphatic saturated monocarboxylic acids, aliphatic saturated dicarboxylic acids, and oxycarboxylic acids from the viewpoint of, for example, not inhibiting an oxidation action of copper and not causing an increase in the viscosity of the etching agent. In particular, preferred examples thereof include formic acid, acetic acid, propionic acid, butyric acid, caproic acid, oxalic acid, lactic acid, malic acid, citric acid, and tartaric acid.

[Other Components]

In the etching agent of the present embodiment, any component that can be blended in a usual etching agent and does not inhibit the purpose of the etching agent of the present embodiment can be appropriately blended.

[pH]

A pH of the etching agent of the present embodiment is preferably adjusted to 6.0 or more and 8.0 or less, 6.2 or more and 7.5 or less, or 6.2 or more and 7.0 or less.

By adjusting the pH to the above range, it is easy to suppress excessive etching due to the galvanic corrosion.

The pH of the etching agent may be adjusted by adjusting the contents of the respective components such as the nitrogen-containing compound, the copper ion source, and the halogen ion source, or may be adjusted by blending a pH adjusting agent.

The etching agent of the present embodiment can suitably perform etching even at a relatively low pH. Thus, the etching agent is easily used even in a manufacturing process that requires etching in a low pH state.

The etching agent of the present embodiment can be prepared by dissolving the respective components in water. Examples of the water include ion-exchanged water, distilled water, pure water, and ultrapure water. The etching agent of the present embodiment may be adjusted so that each of the components has a predetermined concentration at the time of use. For example, a concentrated solution may be prepared in advance and diluted immediately before use so that each component has a predetermined concentration, or a plurality of solutions obtained by mixing some components of all components may be prepared in advance and mixed so that all components are contained at the time of use.

In the etching agent of the present embodiment, the etching rate with respect to copper can be adjusted to, for example, about 0.3 µm/min or more and 1.0 µm/min or less. The etching rate for metals other than copper can be adjusted to 0.1 µm/min or less. When the etching rate is in this range, it is possible to improve selective etchability of copper while reliably suppressing partial excessive etching of copper.

(Method of Manufacturing Circuit Board)

Next, a method of manufacturing a circuit board using the etching agent of the present embodiment will be described.

The manufacturing method of the present embodiment is a method of manufacturing a circuit board in which a circuit is formed by selectively etching a copper layer of a processing target in which a noble metal layer containing a metal nobler than copper and the copper layer coexist using the etching agent of the present embodiment described above.

Examples of the circuit board of the present embodiment include a printed circuit board and a copper circuit member of a film touch sensor. In this case, examples of the processing target in which the noble metal layer containing a metal nobler than copper and the copper layer coexist include a circuit board 10 in which a seed layer 2 (copper layer) is formed on a surface of an insulating resin layer 1 by electroless copper plating as shown in FIG. 1, and a circuit 3 is formed on the seed layer 2 by electrolytic copper plating.

A gold plating layer 4 (noble metal layer) is formed on a surface of the circuit 3 by electrolytic plating or electroless plating. A diffusion prevention layer formed from nickel and the like may be formed between the gold plating layer 4 and the circuit 3 in order to prevent diffusion (not illustrated).

Examples of the metal nobler than copper contained in the noble metal layer formed on the surface of the circuit 3 include palladium, mercury, silver, and platinum in addition to gold.

The etching agent of the present embodiment is suitably used particularly when a circuit board is manufactured using a processing target in which a noble metal layer containing gold and copper coexist.

The circuit board 10 can be formed by, for example, a semi-additive method.

First, the seed layer 2 is formed on the surface of the insulating resin layer 1 by electroless copper plating, a plating resist (not illustrated) is provided on the seed layer 2, and the circuit 3 is formed by electrolytic copper plating. In addition, the diffusion prevention layer and the gold plating layer 4 are formed on the surface of the circuit 3 by plating. Thereafter, the plating resist is removed to obtain the circuit board 10 having the configuration including the circuit 3 as shown in FIG. 1.

Figure 2:
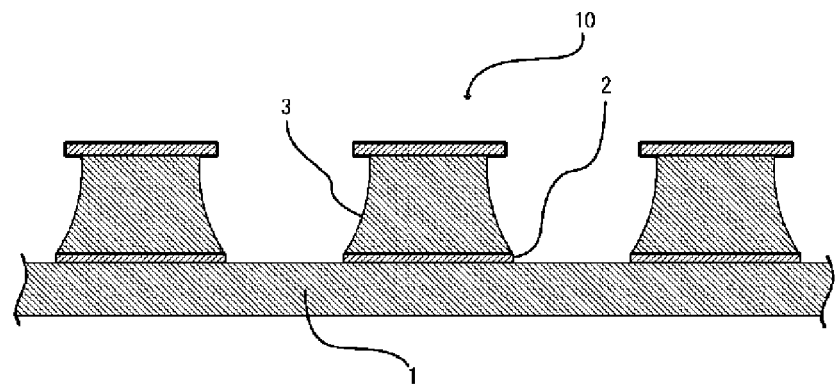
FIG. 2 is a partial cross-sectional view illustrating the outline of the circuit board.

In addition, in order to remove the seed layer 2, remaining on the insulating resin layer 1 between the circuits 3, by etching, in the present embodiment, etching is performed using the etching agent of the present embodiment described above to obtain the circuit board 10 as illustrated in FIG. 2. The circuits 3 may be electrically connected by an inner layer circuit (not illustrated) or the like.

The etching method is not particularly limited, and examples thereof include a spraying method and a method of immersing the processing target in the etching agent. Spray treatment is preferable from the viewpoint of efficiently etching metal in a narrow place such as a seed layer between circuits.

The treatment conditions such as the temperature of the etching agent and the treatment time in the etching treatment are not particularly limited, and examples thereof include the temperature of the etching agent of or higher and 40° C. or lower and the treatment time of seconds or more and 120 seconds or less.

Figure 3:
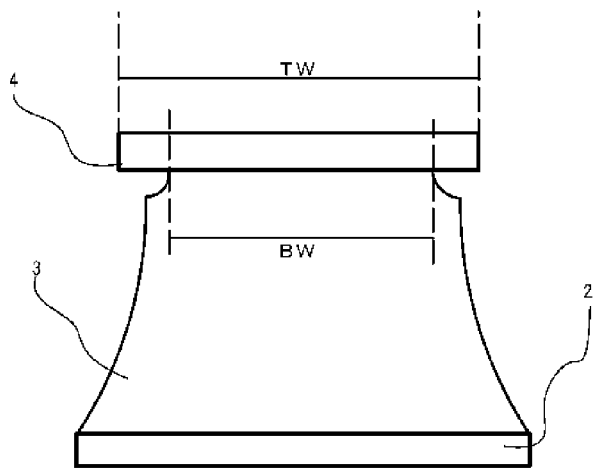
FIG. 3 is a schematic view for explaining measurement of a side etching amount.

When such an etching treatment is performed, gold of the gold plating layer 4 and copper of the circuit 3 coexist, and there are circuits also electrically connected by the inner layer circuit, so that the galvanic corrosion is likely to occur. In this case, as illustrated in FIG. 3, in the vicinity of the gold plating layer 4 on an upper portion of the circuit 3, a state in which a portion is excessively etched and gouged due to galvanic corrosion, that is, side etching may occur. If such side etching excessively progresses, a circuit width becomes narrow, and there is a possibility that electric resistance increases or disconnection occurs.

In the etching agent of the present embodiment, it is possible to maintain the etching rate and perform uniform etching while suppressing side etching due to the galvanic corrosion. The seed layer which is copper, particularly electroless plated copper can be selectively etched. Therefore, an increase in electric resistance, disconnection, and the like of the circuit in the circuit board can also be suppressed.

The method of manufacturing a circuit board according to the present embodiment can be implemented in a manufacturing method by the semi-additive method, but may be implemented in the case of selectively etching a copper layer of a processing target in which a noble metal layer containing a metal nobler than copper and the copper layer coexist in another method.

The etching agent and the method of manufacturing the circuit board according to the present embodiment should be interpreted independently of each other. Therefore, the etching agent of the present embodiment may be used in other manufacturing methods, and each embodiment may be implemented by a combination of other technologies.

Although the etching agent and the method of manufacturing the circuit board according to the present embodiment are as described above, it should be considered that the embodiment disclosed herein is an example in all respects and is not restrictive. The scope of the present invention is defined not by the foregoing description but by the appended claims, and is intended to include all the modifications in the meaning of equivalence to the claims and within the scope of the present invention.

EXAMPLES

Hereinafter, the present invention will be described more specifically with reference to Examples, but the present invention is not limited to these Examples.

(Etching Agent)

Etching agents of Examples and Comparative Examples were prepared using materials shown in Tables 1 to 3 (balance ion-exchanged water).

The following materials were used as raw materials.

A. Halogen Ion Supply Source
  Sodium chloride (manufactured by Kishida Chemical Co., Ltd., First-grade)
  Ammonium bromide (manufactured by Kishida Chemical Co., Ltd., Special-grade)
  Potassium iodide (manufactured by Kishida Chemical Co., Ltd., First-grade)
B. Polyalkylene Glycol
  Polyethylene glycol (manufactured by Kishida Chemical Co., Ltd., First-grade, molecular weight 1,000)
C. Copper Ion Source
  Copper formate (manufactured by FUJIFILM Wako Pure Chemical Corporation, First-grade)
  Copper acetate (manufactured by Kishida Chemical Co., Ltd., First-grade)
D. Amino Group-Containing Compound
  Monoethanolamine (manufactured by FUJIFILM Wako Pure Chemical Corporation, First-grade)
  Triethanolamine (manufactured by Kishida Chemical Co., Ltd., First-grade)
  N-Methyldiethanolamine (manufactured by Tokyo Chemical Industry Co., Ltd., First-grade)
E. Heterocyclic Compound
  2-Methylimidazole (manufactured by Tokyo Chemical Industry Co., Ltd., First-grade)

Imidazole (manufactured by Kishida Chemical Co., Ltd., Special-grade)
F. Organic Acid
Maleic acid (manufactured by FUJIFILM Wako Pure Chemical Corporation, First-grade)
Malic acid (manufactured by Kishida Chemical Co., Ltd., Special-grade)
Lactic acid (manufactured by FUJIFILM Wako Pure Chemical Corporation, First-grade)
d-Tartaric acid (manufactured by Kishida Chemical Co., Ltd., First-grade)
(Measurement of pH)

The pH of each produced etching agent was measured at 30° C. with a pH measuring device F-71 manufactured by HORIBA, Ltd. The results are shown in Table 2.
(Test Substrate)

The following test substrate was provided.

A copper seed layer having a thickness of 0.3 μm was prepared on a resin substrate having a resin layer thickness of 0.2 mm using an electroless copper plating solution (electroless copper plating solution manufactured by Okuno Chemical Industries Co., Ltd.: Adcopper (trade name)). Thereafter, a plating resist (RD-1225 (trade name) manufactured by Hitachi Chemical Company, Ltd.) was used to form a resist, and a plating resist pattern (thickness about 25 μm, line-and-space L/S=15 μm/30 μm) was formed. In addition, an electrolytic copper plating layer having a thickness of 15 μm and a width of 30 μm was prepared using an electrolytic copper plating solution (electrolytic copper plating solution: TOP LUCINA (trade name) manufactured by Okuno Chemical Industries Co., Ltd.). Thereafter, an electrolytic nickel gold plating layer was formed on the electrolytic copper plating layer using an electrolytic nickel gold plating solution. Finally, the resist was removed by treatment with a removing solution (Clean Etch R-100 manufactured by MITSUBISHI GAS CHEMICAL COMPANY, INC.) for 1 minute.
(Etching)

Etching was performed using the etching agents of Examples and Comparative Examples using the test substrate to remove the seed layer exposed between the electrolytic copper plating layers.

Etching was performed using a nozzle (angular nozzle INVV 9030 manufactured by H. IKEUCHI Co., Ltd.) under conditions of a spray pressure of 0.1 MPa and a treatment temperature of 40° C. The treatment time was until the seed layer between the electrolytic copper plating of the test substrate was completely removed. After etching, water washing and drying were performed, and the following evaluation was performed.
(Measurement of Side Etching Amount)

A part of each test substrate after etching was cut, embedded in a thermosetting resin, and polished so that a cross section of the electrolytic copper plating layer can be observed, thereby preparing a sample for observing the cross section. For observation of the cross section of the electrolytic copper plating layer, an image was photographed using SEM, a width TW of a nickel/gold layer and a width BW of the electrolytic copper plating on the electrolytic copper plating layer as shown in FIG. 3 were measured, and Tables 1 to 3 show (TW-BW)÷2 (μm) as a side etching amount.
(Determination of Etching Unevenness)

An electrolytic copper plated plate of 5×5 cm was etched with the etching agent of each Example and Comparative Example under the same conditions as in the etching of each test substrate, and then the copper surface was visually observed. It was determined that there was no unevenness when uniform processing was performed, and it was determined that there was unevenness when there was shading.
(Measurement of Etching Rate)

An electrolytic copper plated plate of 5×5 cm was provided, and a weight $W1$ (g) thereof was measured. Each plating plate was treated with the etching agent of each Example and Comparative Example at 40° C. for 1 minute. A weight $W2$ (g) after the treatment is measured, and the etching rate is calculated by the following formula, and is shown in Tables 1 to 3.

$(W1-W2) \times 10000 \div 223 (\mu m/min)$

The results are shown in Tables 1 to 3.

TABLE 1

| | Halogen ion | | Coper ion source | | Amino group-containing compound | | Heterocyclic compound | |
| | Chloride ion (ppm) | Bromide ion (ppm) | Polyalkylene glycol PEG (wt %) | Copper formate As copper ion (wt %) | Copper acetate As copper ion (wt %) | Mono-ethan-olamine (wt %) | Triethan-olamine (wt %) | 2-Methyl-imidazole (wt %) | Imidazole (wt %) |
|---|---|---|---|---|---|---|---|---|---|
| Example 1 | 50 | | 0.001 | | 3.0 | | 10.0 | 13.5 | |
| Example 2 | 50 | | 0.01 | | 3.0 | | 10.0 | 13.5 | |
| Example 3 | 50 | | 5 | | 3.0 | | 10.0 | 13.5 | |
| Example 4 | 10 | | 0.1 | 2.0 | | 3.0 | | | 3.0 |
| Example 5 | 200 | | 1 | 2.0 | | 3.0 | | | 3.0 |
| Example 6 | | 2 | 3 | | 1.2 | 1.5 | 7.0 | 1.0 | 4.0 |
| Example 7 | | 10 | 3 | | 1.2 | 1.5 | 7.0 | 1.0 | 4.0 |
| Example 8 | | 40 | 3 | | 1.2 | 1.5 | 7.0 | 1.0 | 4.0 |
| Example 9 | | 20 | 5 | | 2.8 | | 5.0 | 4.0 | |
| Example 10 | | 20 | 5 | | 4.6 | | 5.0 | 4.0 | |
| Comparative Example 1 | 0 | | 1 | 4.0 | | 2.0 | | | 2.5 |
| Comparative Example 2 | 800 | | 1 | 4.0 | | 2.0 | | | 2.5 |
| Comparative Example 3 | 50 | | 0 | 2.0 | | 4.0 | | | 7.0 |
| Comparative | 50 | | 0.0001 | 2.0 | | 4.0 | | | 7.0 |

TABLE 1-continued

| | | | | | |
|---|---|---|---|---|---|
| Example 4 | | | | | |
| Comparative Example 5 | 50 | 10 | 2.0 | 4.0 | 7.0 |

| | Total of nitrogen-containing compound (wt %) | Etching rate (μm/min) | Side etching amount (μm) | Presence or absence of occurrence of unevenness | Remarks |
|---|---|---|---|---|---|
| Example 1 | 23.5 | 0.61 | 1.45 | Absence | |
| Example 2 | 23.5 | 0.61 | 1.50 | Absence | |
| Example 3 | 23.5 | 0.52 | 1.55 | Absence | |
| Example 4 | 6.0 | 0.36 | 1.50 | Absence | |
| Example 5 | 6.0 | 0.47 | 1.50 | Absence | |
| Example 6 | 13.5 | 0.40 | 1.25 | Absence | |
| Example 7 | 13.5 | 0.66 | 1.08 | Absence | |
| Example 8 | 13.5 | 0.95 | 1.96 | Absence | |
| Example 9 | 9.0 | 0.61 | 1.05 | Absence | |
| Example 10 | 9.0 | 0.38 | 1.08 | Absence | |
| Comparative Example 1 | 4.5 | 0.14 | 1.20 | Absence | Low etching rate |
| Comparative Example 2 | 4.5 | 1.20 | 5.47 | Absence | Large side etching |
| Comparative Example 3 | 11.0 | 0.61 | Un-measured | Occurrence | Etching unevenness occured |
| Comparative Example 4 | 11.0 | 0.61 | Un-measured | Occurrence | Etching unevenness occured |
| Comparative Example 5 | 11.0 | 0.21 | 1.40 | Absence | Low etching rate |

TABLE 2

| | Halogen ion | | Poly-alkylene glycol PEG (wt %) | Copper ion source | | Amino group-containing compound | | Heterocyclic compound | |
|---|---|---|---|---|---|---|---|---|---|
| | Chloride ion (ppm) | Bromide ion (ppm) | | Copper formate As copper ion (wt %) | Copper acetate As copper ion (wt %) | Monoethan-olamine (wt %) | Triethan-olamine (wt %) | 2-Methyl-imidazole (wt %) | Imidazole (wt %) |
| Example 11 | 50 | | 5 | 2.0 | | | 10.0 | | 7.0 |
| Example 12 | | 10 | 0.1 | | 3.0 | 5.0 | | | 2.5 |
| Example 13 | 100 | | 1 | 3.0 | | | 7.5 | 4.0 | |
| Example 14 | | 20 | 0.01 | | 0.5 | 2.0 | | 2.0 | |

| | Total of nitrogen-containing compound (wt %) | Organic acid (wt %) | pH | Etching rate (μm/min) | Side etching amount (μm) | Presence or absence of occurrence of unevenness |
|---|---|---|---|---|---|---|
| Example 11 | 17.0 | Maleic acid 5 | 6.2 | 0.55 | 1.20 | Absence |
| Example 12 | 7.5 | Malic acid 5 | 6.5 | 0.66 | 1.23 | Absence |
| Example 13 | 11.5 | d-Tartaric acid 5 | 6.8 | 0.66 | 1.15 | Absence |
| Example 14 | 4.0 | Lactic acid 5 | 7.5 | 0.77 | 1.05 | Absence |

TABLE 3

| | Halogen ion | | Poly-alkylene glycol PEG (wt %) | Copper ion source | | Amino group-containing compound (wt %) | Heterocyclic compound (wt %) | Total of nitrogen-containing compound (wt %) | Result | | |
|---|---|---|---|---|---|---|---|---|---|---|---|
| | | | | Copper formate As copper ion (wt %) | Copper acetate As copper ion (wt %) | | | | Etching rate (μm/min) | Side etching amount (μm) | Presence or absence of occurrence of unevenness |
| | Chloride ion (ppm) | Bromide ion (ppm) | | | | | | | | | |
| Example 15 | 100 | | 1 | | 3.0 | Monoethanolamine 3.5 | Imidazole 3.0 | 6.5 | 0.74 | 1.25 | Absence |
| Example 16 | 50 | | 5 | 3.0 | | N-Methyldiethanolamine 7.0 | Imidazole 5.0 | 12.0 | 0.70 | 1.15 | Absence |
| Example 17 | | 20 | 0.1 | | 2.0 | Triethanolamine 10.0 | 2-Methylimidazole 4.0 | 14.0 | 0.75 | 1.10 | Absence |

(Consideration)

As shown in Table 1, in each Example, the amount of side etching was smaller than that in Comparative Example, and the etching rate was maintained. In addition, etching unevenness did not occur.

In Comparative Examples 3 and 4, etching was not performed on the test substrate because etching unevenness occurred.

As shown in Table 2, even when the pH was 8.0 or less, side etching could be suppressed in each Example.

In addition, as shown in Table 3, even when the types of the amino group-containing compound and the heterocyclic compound were changed, side etching could be suppressed in each Example.

REFERENCE SIGNS LIST

1 Insulating resin layer
2 Seed layer (copper layer)
3 Circuit
4 Noble metal layer
10 Circuit board

The invention claimed is:

1. An etching agent that selectively etches a copper layer of a processing target in which a noble metal layer containing a metal nobler than copper and the copper layer coexist, the etching agent comprising:
a copper ion;
one or more heterocyclic compounds having two or more nitrogen atoms in a ring, and one or more amino group-containing compounds having 8 or less carbon atoms;
a polyalkylene glycol; and
a halogen ion,
wherein the polyalkylene glycol is contained in an amount of 0.0005% by weight or more and 7% by weight or less, and
the halogen ion is contained in an amount of 1 ppm or more and 250 ppm or less, and wherein a pH is 6.0 or more and 8.0 or less.

2. The etching agent according to claim 1, wherein the halogen ion is at least one selected from the group consisting of a chloride ion and a bromide ion.

3. The etching agent according to claim 1, wherein a pH is 6.2 or more and 7.5 or less.

4. The etching agent according to claim 1, wherein the copper ion is contained in an amount of 0.5% by weight or more and 10.0% by weight or less.

5. The etching agent according to claim 1, wherein the heterocyclic compounds having two or more nitrogen atoms in a ring, and one or more amino group-containing compounds having 8 or less carbon atoms are contained in an amount of 1.0% by weight or more and 30% by weight or less.

6. The etching agent according to claim 1, wherein an organic acid is not contained, or the organic acid is contained in an amount of more than 0% by weight and less than 7% by weight.

7. The etching agent according to claim 1, wherein the one or more heterocyclic compounds having two or more nitrogen atoms in a ring is an imidazole.

8. The etching agent according to claim 1, wherein the polyalkylene glycol is polyethylene glycol.

9. The etching agent according to claim 1, wherein a pH is 6.2 or more and 7.0 or less.

10. The etching agent according to claim 1, wherein the one or more heterocyclic compounds having two or more nitrogen atoms in a ring are one or more of imidazole, 2-methylimidazole, 1,2-diethylimidazole, benzimidazole, pyrazole, triazole and/or benztriazole.

11. The etching agent according to claim 1, wherein the one or more amino group-containing compounds having 8 or less carbon atoms is one or more of ammonia, methylammonium, dimethylammonium, trimethylammonium, alkanolamine, aniline, ethylenediamine and/or tetramethylammonium.

12. The etching agent according to claim 1, wherein the one or more amino group-containing compounds having 8 or less carbon atoms is one or more of ammonia and/or alkanolamine.

13. The etching agent according to claim 1, wherein the heterocyclic compounds having two or more nitrogen atoms in a ring, and one or more amino group-containing compounds having 8 or less carbon atoms are contained in an amount of 4.0% by weight or more and 25% by weight or less.

14. The etching agent according to claim 1, wherein the heterocyclic compounds having two or more nitrogen atoms in a ring, and one or more amino group-containing compounds having 8 or less carbon atoms are contained in an amount of 10.0% by weight or more and 20% by weight or less.

15. The etching agent according to claim 1, wherein the heterocyclic compounds having two or more nitrogen atoms in a ring, and one or more amino group-containing compounds having 8 or less carbon atoms are contained in an amount of 5.0% by weight or more and 25% by weight or less.

16. A method of manufacturing a circuit board, comprising forming a circuit by selectively etching a copper layer of a processing target in which a noble metal layer containing a metal nobler than copper and the copper layer coexist using the etching agent according to claim 1.

17. The method of manufacturing a circuit board according to claim 16, wherein the noble metal layer is a layer containing gold.

* * * * *